(12) United States Patent
Shirao

(10) Patent No.: US 9,716,501 B2
(45) Date of Patent: Jul. 25, 2017

(54) CR OSCILLATION CIRCUIT

(71) Applicant: SEIKO EPSON CORPORATION, Tokyo (JP)

(72) Inventor: Akira Shirao, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/059,977

(22) Filed: Mar. 3, 2016

(65) Prior Publication Data

US 2016/0301398 A1 Oct. 13, 2016

(30) Foreign Application Priority Data

Apr. 10, 2015 (JP) ................................. 2015-081258

(51) Int. Cl.
| | | |
|---|---|---|
| H03K 3/02 | (2006.01) | |
| H03K 19/0185 | (2006.01) | |
| H03L 7/099 | (2006.01) | |
| H03B 5/00 | (2006.01) | |
| H03B 5/10 | (2006.01) | |
| H03B 5/04 | (2006.01) | |
| H03L 7/097 | (2006.01) | |
| H03L 7/02 | (2006.01) | |
| H03L 7/00 | (2006.01) | |
| H03L 7/089 | (2006.01) | |
| H03K 3/011 | (2006.01) | |
| H03K 3/03 | (2006.01) | |

(52) U.S. Cl.
CPC ....... *H03K 19/018521* (2013.01); *H03B 5/00* (2013.01); *H03B 5/04* (2013.01); *H03B 5/10* (2013.01); *H03K 3/011* (2013.01); *H03K 3/0315* (2013.01); *H03L 7/00* (2013.01); *H03L 7/02* (2013.01); *H03L 7/0891* (2013.01); *H03L 7/097* (2013.01); *H03L 7/099* (2013.01)

(58) Field of Classification Search
CPC ......... H03L 7/0891; H03L 7/00; H03L 7/099; H03L 7/097; H03L 7/02; H03K 19/018521; H03K 17/6872; H03K 4/50; H03B 5/10; H03B 5/00; H03B 5/04
USPC ..... 331/111, 176, 143, 175, 113 R; 327/175, 327/170
See application file for complete search history.

(56) References Cited

U.S. PATENT DOCUMENTS 6,462,625 B2 10/2002 Kim
8,076,980 B2 * 12/2011 Liu ........................ H03K 3/011
331/176

FOREIGN PATENT DOCUMENTS

| JP | 06-104639 A | 4/1994 |
| JP | 2002-033644 A | 1/2002 |
| JP | 2005-167927 A | 6/2005 |

(Continued)

*Primary Examiner* — Arnold Kinkead
(74) *Attorney, Agent, or Firm* — Global IP Counselors, LLP

(57) ABSTRACT

A CR oscillation circuit includes inverters forming a loop for circulation of a signal, CR time constant circuits inserted into the loop for delaying the signal, each circuit having a capacitor, a plurality of resistance elements, and a transmission gate that selects an arbitrary resistance element of the plurality of resistance elements as a charge and discharge path of the capacitor, and a gate voltage generation circuit as means for outputting a gate voltage for controlling ON/OFF of each transmission gate that outputs a constant voltage in conjunction of a threshold voltage of a field-effect transistor as a gate voltage for turning ON the transmission gate.

9 Claims, 4 Drawing Sheets

(56) References Cited

FOREIGN PATENT DOCUMENTS

| | | | |
|---|---|---|---|
| JP | 2008-252414 | A | 10/2008 |
| JP | 2009-246793 | A | 10/2009 |

* cited by examiner

CR OSCILLATION CIRCUIT

BACKGROUND

1. Technical Field

The present invention relates to a CR oscillation circuit including a CR time constant circuit having a capacitor and a resistance element as a charge and discharge path of the capacitor.

2. Related Art

CR oscillation circuits each including a switching gate such as an inverter forming a loop for circulation of a signal and a CR time constant circuit inserted in the middle of the loop for delaying the signal are known. The oscillation frequency of the CR oscillation circuit depends on the time constant of the CR time constant circuit. Therefore, in order to keep the oscillation frequency of the CR oscillation circuit at a target frequency, it is necessary to minimize variations in time constant of the CR time constant circuit. However, the time constant of the CR time constant circuit may vary due to variations in manufacturing of the resistance element of the CR time constant circuit and the oscillation frequency of the CR oscillation circuit may shift from the target frequency. Accordingly, Patent Document 1 (JP-A-2002-33644) proposes a CR oscillation circuit in which, of a plurality of resistance elements, a resistance element serving as a charge and discharge path of a capacitor of the CR oscillation circuit may be selected by a transmission gate. According to the CR oscillation circuit, the resistance element as the charge and discharge path of the capacitor may be appropriately selected by the transmission gate, and thereby, even when there are variations in manufacturing in resistance values of the respective resistance elements, the resistance value of the charge and discharge path of the capacitor may be made as close to a target value as possible and the oscillation frequency of the CR oscillation circuit may be made closer to the target frequency.

In the above described CR oscillation circuit of Patent Document 1, an ON-resistance of the transmission gate fluctuates depending on a power supply voltage. Accordingly, under the technology of related art, a constant power supply voltage is supplied to the CR oscillation circuit by a stabilized power supply. However, in the CR oscillation circuit of Patent Document 1, a threshold voltage of the field-effect transistor forming the transmission gate changes due to changes in ambient temperature. Therefore, the CR oscillation circuit of Patent Document 1 has a problem that the ON-resistance of the transmission gate changes depending on the ambient temperature, the time constant of the CR time constant circuit changes, and the oscillation frequency of the CR oscillation circuit changes.

SUMMARY

An advantage of some aspects of the invention is to provide a CR oscillation circuit in which dependency of an oscillation frequency on temperature changes is suppressed.

An aspect of the invention provides a CR oscillation circuit including at least one switching gate forming a loop for circulation of a signal, a CR time constant circuit inserted into the loop for delaying the signal, the circuit having a capacitor, a plurality of resistance elements, and a selection part that selects an arbitrary resistance element of the plurality of resistance elements as a charge and discharge path of the capacitor, and a control section that controls ON/OFF of the selection part and controls the selection part so that temperature characteristics of a resistance value of the selection part may be constant when the selection part is turned ON.

According to the aspect of the invention, the control section controls the selection part so that the temperature characteristics of the resistance value of the selection part may be constant when the selection part is turned ON. Therefore, the dependency of the oscillation frequency of the CR oscillation circuit on the ambient temperature may be suppressed.

In a preferred aspect, the selection part includes a transmission gate, and the control section has a gate voltage generation unit that outputs a gate voltage for controlling ON/OFF of the transmission gate and outputs a constant voltage in conjunction with a threshold voltage of a field-effect transistor as a gate voltage for turning ON the transmission gate.

According to this aspect, when the threshold voltage of the field-effect transistor forming the transmission gate changes depending on the ambient temperature, the gate voltage for turning ON the transmission gate changes in conjunction with the change of the threshold voltage.

In a preferred aspect, the transmission gate in the CR time constant circuit is provided on a side of an output node and the resistance element is provided on a side of the capacitor of the switching gate. Therefore, the dependency of the ON-resistance of the transmission gate on the ambient temperature in the CR time constant circuit may be suppressed, and the dependency of the oscillation frequency of the CR oscillation circuit on the ambient temperature may be suppressed.

According to this aspect, fluctuations in switching speed of the transmission gate due to variations in manufacturing of the resistance elements do not occur, and thereby, the shift of the oscillation frequency of the CR oscillation circuit from a target frequency may be reduced.

In a preferred aspect, it is preferable that the transmission gate includes a P-channel field-effect transistor and an N-channel field-effect transistor, and the constant voltage output by the gate voltage generation unit is supplied to a substrate of the P-channel field-effect transistor or a substrate of the N-channel field-effect transistor.

According to this aspect, when the threshold voltages of the P-channel field-effect transistor and the N-channel field-effect transistor change due to changes in ambient temperature, the constant voltage supplied to the substrate of the P-channel field-effect transistor or the substrate of the N-channel field-effect transistor of the transmission gate changes in conjunction with the changes in threshold voltage. Therefore, fluctuations in ON-resistance of the P-channel field-effect transistor or the N-channel field-effect transistor of the transmission gate due to changes in ambient temperature may be suppressed and the dependency of the oscillation frequency of the CR oscillation circuit on the ambient temperature may be suppressed.

In a preferred aspect, the switching gate includes a P-channel field-effect transistor and an N-channel field-effect transistor, and the constant voltage output by the gate voltage generation unit is supplied to a source of the P-channel field-effect transistor or a source of the N-channel field-effect transistor of the switching gate.

According to this aspect, when the threshold voltages of the P-channel field-effect transistor and the N-channel field-effect transistor change due to changes in ambient temperature, the constant voltage supplied to the source of the P-channel field-effect transistor or the source of the N-channel field-effect transistor of the switching gate changes in conjunction with the changes in threshold voltage. Therefore, fluctuations in ON-resistance of the P-channel field-effect transistor or the N-channel field-effect transistor of the switching gate due to changes in ambient temperature may be suppressed and the dependency of the oscillation frequency of the CR oscillation circuit on the ambient temperature may be suppressed.

In a preferred aspect, the switching gate includes a P-channel field-effect transistor and an N-channel field-effect transistor, and the constant voltage output by the gate voltage generation unit is supplied to a source and a substrate of the P-channel field-effect transistor of the switching gate or a source and a substrate of the N-channel field-effect transistor of the switching gate.

According to this aspect, in the P-channel field-effect transistor and the N-channel field-effect transistor of the switching gate, increase in threshold voltage due to the back-gate effect does not occur. Therefore, without being affected by the back-gate effect, fluctuations in threshold voltage of the P-channel field-effect transistor or the N-channel field-effect transistor of the switching gate due to changes in ambient temperature are not caused, fluctuations of the P-channel field-effect transistor or the N-channel field-effect transistor of the switching gate due to changes in ambient temperature and fluctuations in ON-resistance of the transmission gate with the fluctuations may be suppressed, and the dependency of the oscillation frequency of the CR oscillation circuit on the ambient temperature may be suppressed.

In a preferred aspect, the control section further includes a resistance control circuit that outputs a selection signal for designating ON/OFF of the transmission gate, and the gate voltage generation unit includes a constant voltage generation circuit that outputs the constant voltage, and a level shifter that is supplied with the constant voltage, shifts a level of the selection signal, and outputs the gate voltage. Here, the level shifter includes e.g. an inverter. Further, the inverter includes e.g. a P-channel field-effect transistor and an N-channel field-effect transistor and, in the CR oscillation circuit, supplies the constant voltage output by the constant voltage generation circuit to a source and a substrate of the P-channel field-effect transistor of the inverter or a source and a substrate of the N-channel field-effect transistor of the switching gate.

According to this aspect, the constant voltage in conjunction with the threshold voltage of the field-effect transistor is provided to the level shifter. Accordingly, the level of the level-shifted control signal is linked with the threshold voltage of the field-effect transistor. Therefore, according to the embodiment, the dependency of the ON-resistance of the transmission gate may be suppressed and the dependency of the oscillation frequency of the CR oscillation circuit on the ambient temperature may be suppressed.

In the above described aspects, it is preferable that the level shifter includes an inverter. In this case, the configuration of the level shifter may be simplified.

Further, it is preferable that the inverter includes a P-channel field-effect transistor and an N-channel field-effect transistor, and the constant voltage output by the constant voltage generation circuit is supplied to a source and a substrate of the P-channel field-effect transistor of the inverter or a source and a substrate of the N-channel field-effect transistor of the switching gate.

According to these aspects, the threshold voltages of the P-channel field-effect transistor and the N-channel field-effect transistor change due to changes in ambient temperature, the constant voltage supplied to the source and the substrate of the P-channel field-effect transistor or the source and the substrate of the N-channel field-effect transistor of the inverter changes in conjunction with the changes in threshold voltage. Therefore, fluctuations in ON-resistance of the P-channel field-effect transistor or the N-channel field-effect transistor of the inverter due to changes in ambient temperature may be suppressed and the dependency of the oscillation frequency of the CR oscillation circuit on the ambient temperature may be suppressed.

In a preferred aspect, the gate voltage generation unit includes a constant voltage generation circuit that has a differential transistor pair of two field-effect transistors with different threshold voltages and outputs an offset voltage due to a difference between the threshold voltages as the constant voltage.

According to this aspect, the constant voltage in conjunction with the threshold voltage of the field-effect transistor may be generated by a simple configuration.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Figure 1:
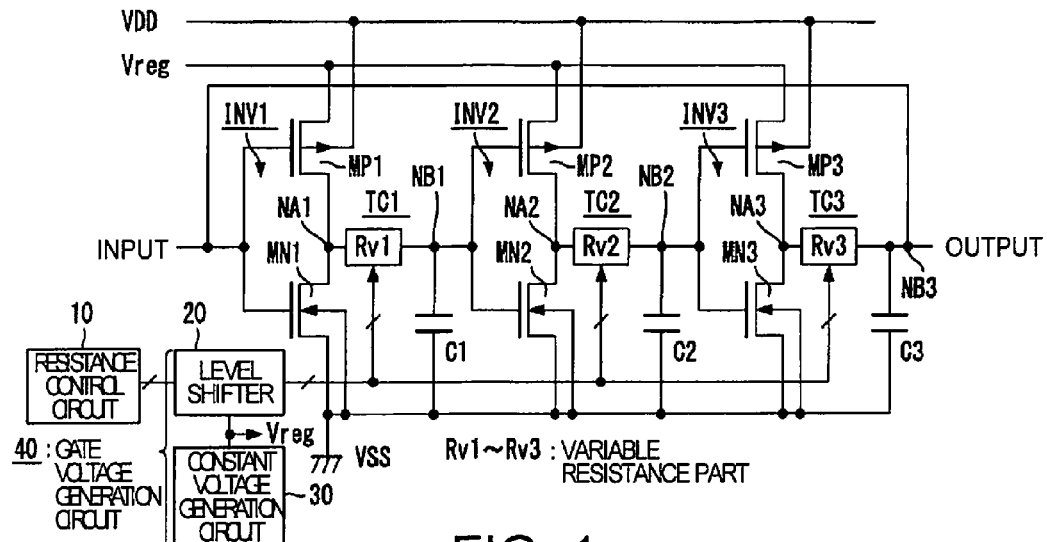
FIG. 1 is a circuit diagram showing a configuration of a CR oscillation circuit as one embodiment of the invention.

FIG. 1 is a circuit diagram showing a configuration of a CR oscillation circuit as one embodiment of the invention. In FIG. 1, inverters INV1, INV2, and INV3 are a type of switching gate that performs logical inversion and forms a loop for circulation of a signal. Here, the inverter INV1 includes a P-channel field-effect transistor MP1 and an N-channel field-effect transistor MN1, the inverter INV2 includes a P-channel field-effect transistor MP2 and an N-channel field-effect transistor MN2, and the inverter INV3 includes a P-channel field-effect transistor MP3 and an N-channel field-effect transistor MN3. In the P-channel field-effect transistors MP1, MP2, and MP3, a high-potential power supply voltage VDD is provided to the respective substrates (or N-wells) and a constant voltage Vreg is provided to the respective sources. In the N-channel field-effect transistors MN1, MN2, and MN3, a low-potential power supply voltage (or the ground voltage) VSS is provided to the respective substrates (or P-wells) and the respective sources.

In the inverter INV1, the gate of the P-channel field-effect transistor MP1 and the gate of the N-channel field-effect transistor MN1 are commonly connected in a node NB3, and the node NB3 serves as an input terminal of the inverter INV1. Further, in the inverter INV1, the drain of the P-channel field-effect transistor MP1 and the drain of the N-channel field-effect transistor MN1 are commonly connected in a node NA1, and the node NA1 serves as an output terminal of the inverter INV1. The same applies to the other inverters INV2 and INV3, and a node NB1 serves as an input terminal of the inverter INV2, a node NA2 serves as an output terminal of the inverter INV2, a node NB2 serves as an input terminal of the inverter INV3, a node NA3 serves as an output terminal of the inverter INV3.

CR time constant circuits TC1, TC2, TC3 are inserted between the inverters INV1 and INV2, between the inverters INV2 and INV3, and between the inverters INV3 and INV1, respectively. The CR time constant circuit TC1 includes a variable resistance part Rv1 inserted between the nodes NA1 and NB1 and a capacitor C1 inserted between the node NB1 and a low-potential power supply line that supplies the power supply voltage VSS. The same applies to the other CR time constant circuits, and the CR time constant circuit TC2 includes a variable resistance part Rv2 and a capacitor C2 and the CR time constant circuit TC3 includes a variable resistance part Rv3 and a capacitor C3.

The CR oscillation circuit according to the embodiment has a resistance control circuit 10 and a gate voltage generation circuit 40 including a level shifter 20 and a constant voltage generation circuit 30 as means for controlling resistance values of the variable resistance parts Rv1 to Rv3.

Here, the resistance control circuit 10 is a circuit that outputs a selection signal Si (i=1 to N, N is an integer equal to or more than two) for controlling the resistance values of the variable resistance parts Rv1 to Rv3. The selection signal Si (i=1 to N) is a binary signal at an H-level=VDD or an L-level=VSS.

The level shifter 20 is a circuit that shifts the level of each selection signal Si (i=1 to N) to a binary signal at an H-level=Vreg and an L-level=VSS and outputs the signal as a two-phase complementary signal. Each of the variable resistance parts Rv1 to Rv3 changes the resistance value intervening between the input node and the output node (e.g. for the variable resistance part Rv1, between the node NA1 and the node NB1) in response to the selection signal Si (i=1 to N).

The constant voltage generation circuit 30 is a circuit that generates the constant voltage Vreg in conjunction with the threshold voltages of the field-effect transistors forming the circuit. The constant voltage Vreg is provided to the respective sources of the above described P-channel field-effect transistors MP1, MP2, and MP3 and provided to the level shifter 20 as the power supply voltage. Further, the constant voltage Vreg is also provided to the variable resistance parts Rv1 to Rv3.

Figure 2:
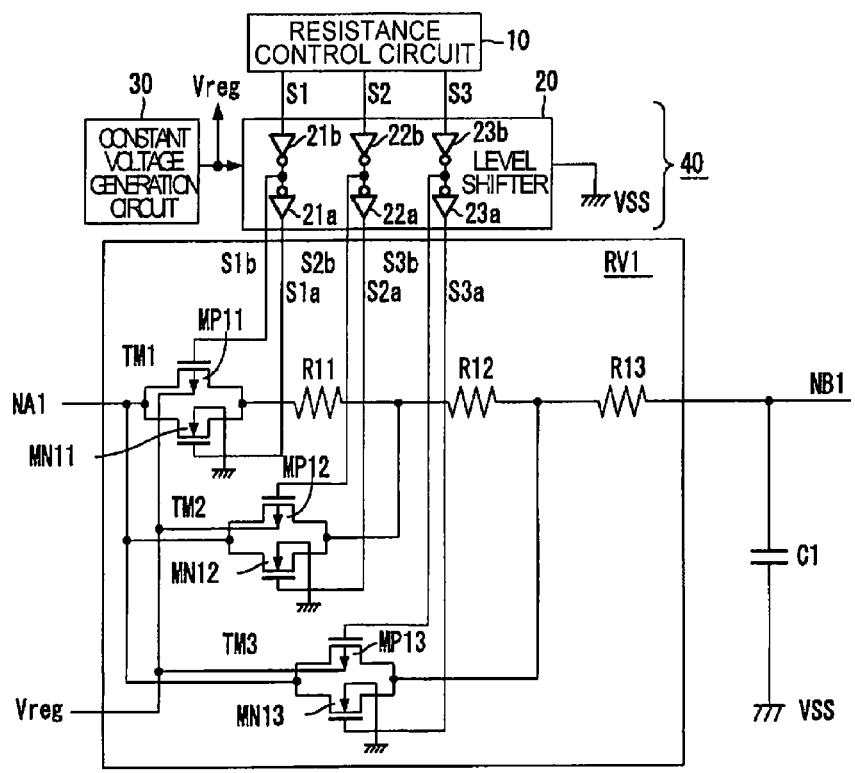
FIG. 2 is a circuit diagram showing configurations of a variable resistance part and a level shifter in the embodiment and a relationship between those and a resistance control circuit and a constant voltage generation circuit.

FIG. 2 is a circuit diagram showing configurations of the variable resistance part Rv1 and the level shifter 20 and a relationship between those and the resistance control circuit 10 and the constant voltage generation circuit 30. Note that FIG. 2 shows only the configuration of the variable resistance part Rv1 of the variable resistance parts Rv1 to Rv3 in FIG. 1, and the other variable resistance parts Rv2 and Rv3 have the same configuration as that of the variable resistance part Rv1.

In the example shown in FIG. 2, the variable resistance part Rv1 includes resistance elements R11, R12, and R13 and transmission gates TM1, TM2, and TM3. Here, the resistance elements R11, R12, and R13 are series-connected and one end of the resistance element R13 is connected to the node NB1. Further, the transmission gate TM1 is inserted between the node NA1 and one end of the resistance element R11, the transmission gate TM2 is inserted between the node NA1 and a common node between the resistance elements R11 and R12, and the transmission gate TM3 is inserted between the node NA1 and a common node between the resistance elements R12 and R13.

Therefore, when only the transmission gate TM1 is turned ON, the resistance elements R11, R12, R13 are series-connected between the nodes NA1 and NB1. Or, when only the transmission gate TM2 is turned ON, the resistance elements R12, R13 are series-connected between the nodes NA1 and NB1. Or, when only the transmission gate TM3 is turned ON, the resistance element R13 is series-connected between the nodes NA1 and NB1.

In this manner, the transmission gate to be turned ON is changed among the transmission gates TM1, TM2, TM3, and thereby, the resistance value of the charge and discharge path of the capacitor C1 may be changed. That is, the transmission gates TM1, TM2, TM3 function as selection parts that select arbitrary resistance elements of the plurality of resistance elements R11, R12, R13 as the charge and discharge path of the capacitor C1. Note that, in FIG. 2, for prevention of complication of the drawing, the variable resistance part Rv1 including the three resistance elements R11, R12, R13 and the three transmission gates TM1, TM2, TM3 is shown, however, the variable resistance part Rv1 may include more resistance elements and transmission gates for more accurate adjustment of the resistance value of the variable resistance part Rv1.

The transmission gate TM1 includes a P-channel field-effect transistor MP11 and an N-channel field-effect transistor MN11. Here, regarding the P-channel field-effect transistor MP11 and the N-channel field-effect transistor MN11, the respective sources are commonly connected in the node NA1. Further, regarding the P-channel field-effect transistor MP11 and the N-channel field-effect transistor MN11, the respective drains are commonly connected on one end of the resistance element R11.

The transmission gate TM2 includes a P-channel field-effect transistor MP12 and an N-channel field-effect transistor MN12. Here, regarding the P-channel field-effect transistor MP12 and the N-channel field-effect transistor MN12, the respective sources are commonly connected in the node NA1. Further, regarding the P-channel field-effect transistor MP12 and the N-channel field-effect transistor MN12, the respective drains are commonly connected in the common node between the resistance elements R11 and R12.

The transmission gate TM3 includes a P-channel field-effect transistor MP13 and an N-channel field-effect transistor MN13. Here, regarding the P-channel field-effect transistor MP13 and the N-channel field-effect transistor MN13, the respective sources are commonly connected in the node NA1. Further, regarding the P-channel field-effect transistor MP13 and the N-channel field-effect transistor MN13, the respective drains are commonly connected in the common node between the resistance elements R12 and R13.

The constant voltage Vreg output by the constant voltage generation circuit 30 is provided to the respective substrates (or N-wells) of the P-channel field-effect transistors MP11, MP12, and MP13. The low-potential power supply voltage (or the ground voltage) VSS is provided to the respective substrates (or P-wells) of the N-channel field-effect transistors MN11, MN12, and MN13.

In the example shown in FIG. 2, the resistance control circuit 10 outputs selection signals S1 to S3 for ON/OFF switching of the respective transmission gates TM1 to TM3. As shown in FIG. 2, the level shifter 20 has inverters 21a, 21b, 22a, 22b, 23a, 23b. Here, the inverter 21b logically inverts and outputs the selection signal S1 as a gate signal S1b, and the inverter 21a logically inverts and outputs the gate signal S1b as a selection signal S1a. Similarly, the inverter 22a outputs a gate signal S2a of the same logic as the selection signal S2 and the inverter 22b outputs a gate signal S2b formed by logically inverting the selection signal S2, and the inverter 23a outputs a gate signal S1a of the same logic as the selection signal S3 and the inverter 23b outputs a gate signal S3b formed by logically inverting the selection signal S3.

The constant voltage Vreg output by the constant voltage generation circuit 30 is provided to the inverters 21a, 21b, 22a, 22b, 23a, 23b as a power supply voltage. More specifically, each of the inverters 21a, 21b, 22a, 22b, 23a, 23b includes a P-channel field-effect transistor and an N-channel field-effect transistor. The constant voltage Vreg output by the constant voltage generation circuit 30 is provided to the source and the substrate of the P-channel field-effect transistor of each inverter. Further, the low-potential power supply voltage VSS is provided to the source and the substrate of the N-channel field-effect transistor of each inverter. Therefore, the gate signals S1a, S1b, S2a, S2b, S3a, S3b output by these inverters are signals at an H-level of Vreg and at an L-level of VSS. The gate signals S1b, S2b, S3b are provided to the respective gates of the P-channel field-effect transistors MP11, MP12, MP13 and the gate signals S1a, S2a, S3a are provided to the respective gates of the N-channel field-effect transistors MN11, MN12, MN13.

Figure 3:
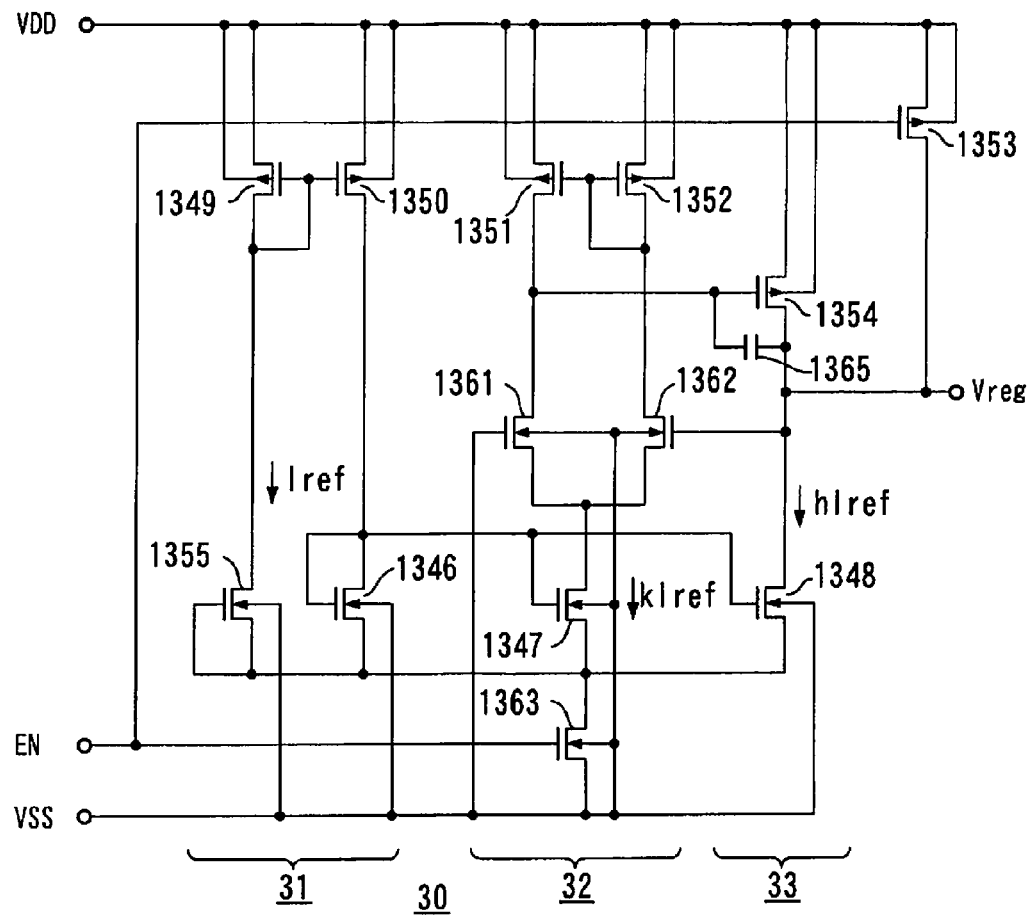
FIG. 3 is a circuit diagram showing a configuration example of the constant voltage generation circuit in the embodiment.

FIG. 3 is a circuit diagram showing a configuration example of the constant voltage generation circuit 30. The constant voltage generation circuit 30 includes P-channel field-effect transistors 1349, 1350, 1351, 1352, 1353, 1354, and N-channel field-effect transistors 1355, 1346, 1347, 1348, 1363, 1361, 1362. Here, the N-channel field-effect transistors 1355 and 1361 are depression-type field-effect transistors having negative threshold voltages and the other N-channel field-effect transistors 1346, 1347, 1348, 1363, 1362 are enhancement-type field-effect transistors having positive threshold voltages.

Regarding the N-channel field-effect transistor 1363, the low-potential power supply voltage VSS is provided to the source and the substrate (or P-well) and an enable signal EN is provided to the gate. Further, regarding the P-channel field-effect transistor 1353, the high-potential power supply voltage VDD is provided to the source and the substrate (or N-well), the drain is connected to a node that outputs the constant voltage Vreg, and an enable signal EN is provided to the gate.

When the constant voltage generation circuit 30 is allowed to perform an operation of outputting the constant voltage Vreg in conjunction with the threshold voltage of the field-effect transistor, the enable signal EN is set at the H-level (VDD). In this case, the N-channel field-effect transistor 1363 turns ON and the drain of the N-channel field-effect transistor 1363 is at the same potential as the low-potential power supply voltage VSS. Further, the P-channel field-effect transistor 1353 turns OFF.

On the other hand, when the constant voltage generation circuit 30 is not allowed to perform the operation of outputting the constant voltage Vreg in conjunction with the threshold voltage of the field-effect transistor, the enable signal EN is set at the L-level (VSS). In this case, the N-channel field-effect transistor 1363 turns OFF. Further, the P-channel field-effect transistor 1353 turns ON and the high-potential power supply voltage VDD is output from the constant voltage generation circuit 30 as the voltage Vreg.

As shown in FIG. 3, the constant voltage generation circuit 30 has a reference current generation part 31, a differential amplification part 32, and a negative feedback part 33.

In the reference current generation part 31, regarding the N-channel field-effect transistor 1355, the low-potential power supply voltage VSS is provided to the substrate (or P-well) and the gate and the source are commonly connected to the drain of the N-channel field-effect transistor 1363. The drain and the gate of the P-channel field-effect transistor 1349 are connected and the gate of the P-channel field-effect transistor 1350 is connected to the drain of the N-channel field-effect transistor 1355. Here, the high-potential power supply voltage VDD is provided to the sources and the substrates (or N-wells) of the respective P-channel field-effect transistors 1349 and 1350. Further, the drain and the gate of the N-channel field-effect transistor 1346 are connected to the drain of the P-channel field-effect transistor 1350. Furthermore, regarding the N-channel field-effect transistor 1346, the low-potential power supply voltage VSS is provided to the substrate (or P-well) and the source is connected to the drain of the N-channel field-effect transistor 1363.

In the above described configuration, a voltage between the gate and the source of the depression-type N-channel field-effect transistor 1355 is 0 V. Therefore, the enable signal EN is at the H-level and, when the N-channel field-effect transistor 1363 is ON, a saturation current Iref proportional to the square of the threshold voltage of the N-channel field-effect transistor 1355 flows in the N-channel field-effect transistor 1355, and the current Iref flows in the P-channel field-effect transistor 1349. Here, the P-channel field-effect transistors 1349 and 1350 form a current mirror. Therefore, a constant current proportional to the saturation current Iref of the N-channel field-effect transistor 1355 flows in the P-channel field-effect transistor 1350 and the current flows in the N-channel field-effect transistor 1346.

In the differential amplification part 32, the source of the N-channel field-effect transistor 1347 is connected to the drain of the N-channel field-effect transistor 1363. The low-potential power supply voltage VSS is provided to the substrate (or P-well) of the N-channel field-effect transistor 1347. Then, the N-channel field-effect transistor 1347 has the gate connected to the common connection point of the gate and the drain of the N-channel field-effect transistor 1346, and forms a current mirror with the N-channel field-effect transistor 1346. Therefore, when the enable signal EN is at the H-level and the N-channel field-effect transistor 1363 is ON, the N-channel field-effect transistor 1347 functions as a constant current source of flowing a constant current kIref proportional to the saturation current Iref of the N-channel field-effect transistor 1355.

The low-potential power supply voltage VSS is provided to the substrates (or N-wells) of the N-channel field-effect transistors 1361 and 1362. The N-channel field-effect transistors 1361 and 1362 form a differential transistor pair, and its common source is connected to the drain of the N-channel field-effect transistor 1347. On the other hand, the constant voltage Vreg is negatively fed back from the negative feedback part 33 to the gate of the N-channel field-effect transistor 1362.

The P-channel field-effect transistors 1351 and 1352 have the respective sources and substrates (or N-wells) provided with the high-potential power supply voltage VDD and form load of the differential transistor pair. More specifically, the drain of the N-channel field-effect transistor 1361 is connected to the drain of the P-channel field-effect transistor 1351. Further, the drain of the N-channel field-effect transistor 1362 is connected to the drain of the P-channel field-effect transistor 1352 and the respective gates of the P-channel field-effect transistors 1351 and 1352.

In the negative feedback part 33, regarding the N-channel field-effect transistor 1348, the source is connected to the drain of the N-channel field-effect transistor 1363 and the low-potential power supply voltage VSS is provided to the substrate (or P-well). Further, the N-channel field-effect transistor 1348 has the gate connected to the common connection point of the gate and the drain of the N-channel field-effect transistor 1346 and forms a current mirror with the N-channel field-effect transistor 1346. Therefore, when the enable signal EN is at the H-level and the N-channel field-effect transistor 1363 is ON, the N-channel field-effect transistor 1348 functions as a constant current source of flowing a constant current hIref proportional to the saturation current Iref of the N-channel field-effect transistor 1355.

The drain of the P-channel field-effect transistor 1354 is connected to the drain of the N-channel field-effect transistor 1348. The high-potential power supply voltage VDD is provided to the source and the substrate (or N-well) of the P-channel field-effect transistor 1354. Further, a signal of the connection node between the drains of the N-channel field-effect transistor 1361 and the P-channel field-effect transistor 1351, i.e., the output signal of the differential amplification part 32 is provided to the gate of the P-channel field-effect transistor 1354. Note that a capacitor 1365 for phase compensation is inserted between the gate and the drain of the P-channel field-effect transistor 1354. The connection node between the drains of the N-channel field-effect transistor 1348 and the P-channel field-effect transistor 1354 serves as an output node of the voltage Vreg, and the voltage Vreg is negatively fed back to the gate of the N-channel field-effect transistor 1362.

The configuration of the constant voltage generation circuit 30 is as described above.

Figure 4:
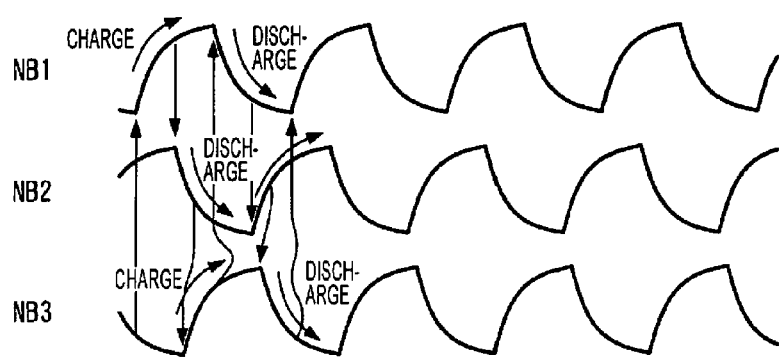
FIG. 4 is a waveform chart illustrating waveforms of the respective parts of the CR oscillation circuit.

Next, an operation of the embodiment will be explained. FIG. 4 is a waveform chart illustrating waveforms of the nodes NB1 to NB3 of the CR oscillation circuit during oscillation.

In the inverters INV1 to INV3, the voltage Vreg is provided to the sources of the P-channel field-effect transistors MP1 to MP3. Further, the voltage VSS is provided to the sources of the N-channel field-effect transistors MN1 to MN3.

Here, when the voltage of the node NB3 falls and the voltage between the gate and the source of the P-channel field-effect transistor MP1 exceeds the threshold voltage of the transistor, the transistor turns ON. On the other hand, when the voltage of the node NB3 falls and the voltage between the gate and the source of the N-channel field-effect transistor MN1 falls below the threshold voltage of the transistor, the transistor turns OFF. As a result, charge is charged in the capacitor C1 via the P-channel field-effect transistor MP1 and the variable resistance part Rv1, and the charge voltage of the node NB1 rises by the charging.

When the charge voltage of the node NB1 rises and the voltage between the gate and the source of the P-channel field-effect transistor MP2 of the inverter INV2 falls below the threshold voltage of the transistor, the P-channel field-effect transistor MP2 turns OFF. On the other hand, when the charge voltage of the node NB1 rises and the voltage between the gate and the source of the N-channel field-effect transistor MN2 of the inverter INV2 exceeds the threshold voltage of the transistor, the N-channel field-effect transistor MN2 turns ON. As a result, the charge charged in the capacitor C2 is discharged via the variable resistance part Rv2 and the N-channel field-effect transistor MN2 and the charge voltage of the node NB2 falls.

When the charge voltage of the node NB2 falls and the voltage between the gate and the source of the P-channel field-effect transistor MP3 of the inverter INV3 exceeds the threshold voltage of the transistor, the P-channel field-effect transistor MP3 turns ON. On the other hand, when the charge voltage of the node NB2 falls and the voltage between the gate and the source of the N-channel field-effect transistor MN3 of the inverter INV3 falls below the threshold voltage of the transistor, the N-channel field-effect transistor MN3 turns OFF. As a result, charge is charged in the capacitor C3 via the P-channel field-effect transistor MP3 and the variable resistance part Rv3, and the charge voltage of the node NB3 rises.

When the voltage of the node NB3 rises and the voltage between the gate and the source of the P-channel field-effect transistor MP1 falls below the threshold voltage of the transistor, the transistor turns OFF. On the other hand, when the voltage of the node NB3 rises and the voltage between the gate and the source of the N-channel field-effect transistor MN1 exceeds the threshold voltage of the transistor, the transistor turns ON. As a result, the charge charged in the capacitor C1 is discharged via the variable resistance part Rv1 and the N-channel field-effect transistor MN1 and the charge voltage of the node NB1 falls.

Subsequently, the same operation is repeated and the CR oscillation circuit oscillates.

The oscillation frequency of the CR oscillation circuit is affected by the time constants of the CR time constant circuits TC1 to TC3 and affected by the resistance values of the variable resistance parts Rv1 to Rv3. Further, in the embodiment, in the respective variable resistance parts Rv1 to Rv3, the transmission gates TM1 to TM3 are used as means for selecting the resistance elements used for the charge and discharge paths of the capacitors C1 to C3. Therefore, in the embodiment, the ON-resistances of the transmission gates TM1 to TM3 affect the oscillation frequency of the CR oscillation circuit.

Furthermore, in the embodiment, the gate voltage Vreg for turning ON the transmission gates TM1 to TM3 is generated by the constant voltage generation circuit 30. The operation of the constant voltage generation circuit 30 will be described.

In the constant voltage generation circuit 30 shown in FIG. 3, when the voltage Vreg tends to increase, increase of the drain current of the N-channel field-effect transistor 1362 and rise of the potential of the common source of the N-channel field-effect transistors 1361 and 1362 are caused, and the drain current of the N-channel field-effect transistor 1361 tends to decrease. As a result, the voltage between the gate and the source of the P-channel field-effect transistor 1354 decreases and the rise of the voltage Vreg is suppressed. In reverse, when the voltage Vreg tends to decrease, decrease of the drain current of the N-channel field-effect transistor 1362 and reduction of the potential of the common source of the N-channel field-effect transistors 1361 and 1362 are caused, and the drain current of the N-channel field-effect transistor 1361 tends to increase. As a result, the voltage between the gate and the source of the P-channel field-effect transistor 1354 increases and the reduction of the voltage Vreg is suppressed. As a result of the negative feedback control, the drain current flowing in the N-channel field-effect transistor 1361 and the drain current flowing in the N-channel field-effect transistor 1362 become equal in equilibrium.

Here, the N-channel field-effect transistors 1361 and 1362 respectively have different threshold voltages, and the differential transistor pair of the N-channel field-effect transistors 1361 and 1362 has an offset voltage due to the difference between the threshold voltages (the difference in work function between both transistors). Further, through the negative feedback operation performed by the negative feedback part 33, gate voltages different by the offset voltage from each other are provided to the respective gates of the N-channel field-effect transistors 1361 and 1362, the voltages are the same as the voltages that contribute to channel formation in the respective N-channel field-effect transistors 1361 and 1362, and the respective currents flowing in the N-channel field-effect transistors 1361 and 1362 become the same. Under the condition, the offset voltage corresponding to the difference between the threshold voltages of the N-channel field-effect transistors 1361 and 1362 is output as the voltage Vreg.

In FIG. 2, suppose that the resistance control circuit 10 outputs e.g. the selection signals S1=H-level, S2=L-level, S3=L-level. In this case, the gate signal S1a=Vreg is provided to the N-channel field-effect transistor MN11, the gate signal S1b=VSS is provided to the P-channel field-effect transistor MP11, and the transmission gate TM1 is turned ON. Further, the gate signal S2a=VSS is provided to the N-channel field-effect transistor MN12, the gate signal S2b=Vreg is provided to the P-channel field-effect transistor MP12, and the transmission gate TM2 is turned OFF. The gate signal S3a=VSS is provided to the N-channel field-effect transistor MN13, the gate signal S3b=Vreg is provided to the P-channel field-effect transistor MP13, and the transmission gate TM3 is turned OFF. Furthermore, VSS=0 V is provided to the substrates of the N-channel field-effect transistors MN11, MN12, MN13, and the constant voltage Vreg generated by the constant voltage generation circuit 30 is provided to the substrates of the P-channel field-effect transistors MP11, MP12, MP13.

Here, when attention is focused on the transmission gate TM1 that is turned ON, the voltage between the gate and the substrate of the N-channel field-effect transistor MN11 is Vreg and the voltage between the gate and the substrate of the P-channel field-effect transistor MP11 is −Vreg, and both voltages are linked with the threshold voltages Vth=VTN or VTP of the field-effect transistors. Therefore, even when the threshold voltages of the respective field-effect transistors forming the transmission gate TM1 change due to changes in ambient temperature of the CR oscillation circuit, the voltages between the gates and the substrates of the field-effect transistors change according to the changes, and thereby, the transmission gate TM1 maintains nearly the same ON-resistance RON. As descried above, the resistance control circuit 10 and the gate voltage generation circuit 40 including the level shifter 20 and the constant voltage generation circuit 30 in the embodiment function as control means for controlling ON/OFF of the transmission gates TM1 to TM3 as the selection parts and controlling the selection parts so that the temperature characteristics of the resistance values of the selection parts may be constant when the selection parts are turned ON.

Figures 5A, 5B:
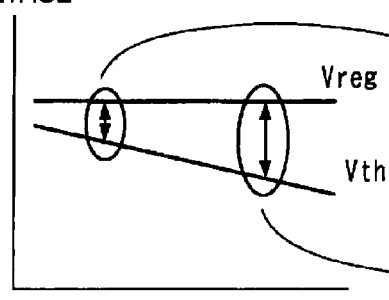
FIGS. 5A to 5D are diagrams for explanation of an effect of the embodiment in comparison with a technology of related art.

FIGS. 5A to 5D are diagrams for explanation of an effect of the embodiment in comparison with a technology of related art. Under the technology of related art, the voltage VDD or −VDD is provided between the gates and the substrates of the field-effect transistors of the transmission gate to be turned ON. Further, the power supply voltage VDD is constantly maintained at the constant value independently of the ambient temperature. However, when the ambient temperature rises, as shown in FIG. 5A, the threshold voltage Vth of the field-effect transistor forming the transmission gate decreases. Accordingly, as shown in FIG. 5B, when the the ambient temperature rises, there is a problem that the ON-resistance RON of the transmission gate decreases and the oscillation frequency of the CR oscillation circuit rises.

Figures 5C, 5D:
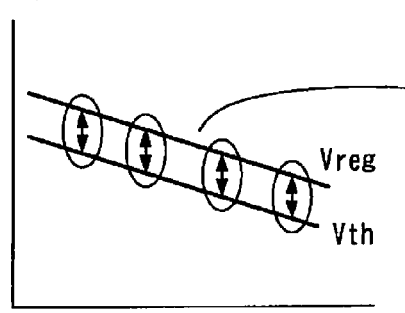

On the other hand, in the embodiment, the voltage Vreg or −Vreg is provided between the gates and the substrates of the field-effect transistors of the transmission gate to be turned ON. As shown in FIG. 5C, when the threshold voltage Vth of the field-effect transistor forming the transmission gate decreases due to rise of the ambient temperature, the voltage Vreg decreases in conjunction with the threshold voltage Vth. Accordingly, as shown in FIG. 5D, even when the ambient temperature rises, the voltages that contribute to channel formation of the respective field-effect transistors forming the transmission gate are kept constant and the ON-resistance RON of the transmission gate is kept constant. Therefore, according to the embodiment, an advantage that the dependency of the oscillation frequency of the CR oscillation circuit on the ambient temperature may be suppressed is obtained. Further, in the embodiment, the voltage Vreg is provided to the sources of the P-channel field-effect transistors MP1 to MP3 of the inverters INV1 to INV3. Accordingly, for example, in the case where the threshold voltages of the P-channel field-effect transistors MP1 to MP3 decrease due to the rise of the ambient temperature, the source voltages of the respective P-channel field-effect transistors MP1 to MP3 decrease in conjunction with the threshold voltages. Therefore, fluctuations of the ON-resistances of the P-channel field-effect transistors MP1 to MP3 of the inverters INV1 to INV3 due to changes in ambient temperature may be suppressed. Also, in this regard, the dependency of the oscillation frequency of the CR oscillation circuit on the ambient temperature may be suppressed.

Further, in the embodiment, in the CR time constant circuits TC1 to TC3, the transmission gates TM1 to TM3 are provided on the sides of the output nodes and the resistance elements R11 to R13 are provided on the sides of the capacitors C1 to C3 of the inverters INV1 to INV3. Accordingly, in the embodiment, fluctuation in switching speed of the transmission gates TM1 to TM3 may be suppressed.

Figure 6:
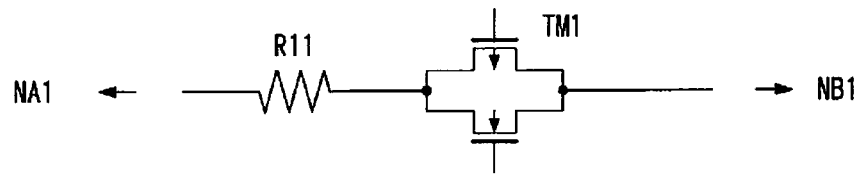
FIG. 6 is a circuit diagram showing a configuration example of a variable resistance part as a comparative example of the embodiment.

As shown in FIG. 6, if the resistance elements R11 etc. are provided on the sides of the output nodes (in the illustrated example, on the side of the node NA1) and the transmission gates TM1 etc. are provided on the sides of the capacitors C1 to C3 (in the illustrated example, on the side of the node NB1) of the inverters INV1 to INV3, the times when the potentials of the source terminals of the transmission gates TM1 etc. (in the illustrated example, the connection point between the transmission gate TM1 and the resistance element R11) vary due to variations in manufacturing of the resistance elements R11 etc. As a result, a problem that the switching speeds of the transmission gates TM1 to TM3 vary and the oscillation frequency of the CR oscillation circuit fluctuates occurs.

On the other hand, in the embodiment, the transmission gates TM1 to TM3 are provided on the sides of the output nodes and the resistance elements R11 to R13 are provided on the sides of the capacitors C1 to C3 of the inverters INV1 to INV3, and thereby, fluctuations in switching speed of the transmission gates TM1 to TM3 due to variations in manufacturing of the resistance elements R11 to R13 do not occur.

As above, one embodiment of the invention is explained, and other embodiments are conceivable for the invention as follows, for example.

(1) In the above described embodiment, the high-potential power supply voltage VDD is provided to the respective substrates of the P-channel field-effect transistors MP1 to MP3 and the constant voltage Vreg is provided to the respective sources of the inverters INV1 to INV3.

In the configuration, when the voltage difference between the high-potential power supply voltage VDD and the constant voltage Vreg is larger, the threshold voltages of the P-channel field-effect transistors MP1 to MP3 increase due to the back-gate effect. In this case, the response speeds and the output impedance of the inverters INV1 to INV3 are deteriorated, and thereby, the resistance components of the transmission gates TM1 to TM3 fluctuate. Therefore, in consideration of the changes in ambient temperature, in the transmission gates TM1 to TM3, the changes in threshold voltage due to the back-gate effect are added to the changes in threshold voltage of the field-effect transistors due to the changes in ambient temperature, and a problem that the oscillation frequency of the CR oscillation circuit shifts from a desired oscillation frequency may occur.

Accordingly, in the embodiment, the constant voltage Vreg is provided to the substrates of the P-channel field-effect transistors MP1 to MP3 of the inverters INV1 to INV3 for suppression of fluctuations in threshold voltage. According to the configuration, in the P-channel field-effect transistors MP1 to MP3 of the inverters INV1 to INV3, the threshold voltages do not increase due to the back-gate effect, and the fluctuations of the resistance components of the transmission gates TM1 to TM3 with respect to the temperature changes may be suppressed.

(2) In the above described embodiment, the inverters are used as the switching gates forming the loop for circulation of signals, however, as the switching gates, other switching gates than the inverters such as NAND gates or NOR gates may be used.

(3) In the above described embodiment, the loop for circulation of signals is formed by the three stages of inverters, however, the number of stages of inverters forming the loop is arbitrary.

(4) In the above described embodiment, the CR time constant circuits are provided between the respective adjacent two inverters, e.g. between the inverters INV1 and INV2, between the inverters INV2 and INV3, and between the inverters INV3 and INV1. However, instead, the CR time constant circuit may be provided only between part of the adjacent two inverters, e.g., only between the inverters INV1 and INV2.

(5) In the constant voltage generation circuit (FIG. 3) in the above described embodiment, the gate of the N-channel field-effect transistor 1361 is fixed to the low-potential power supply voltage VSS. However, instead, for example, the voltage between the high-potential power supply voltage VDD and the low-potential power supply voltage VSS may be divided by a divider circuit including a plurality of resistance elements and the output voltage of the divider circuit may be provided to the gate of the N-channel field-effect transistor 1361. Further, in the embodiment, the divider circuit may be formed using variable resistances, and the voltage provided to the gate of the N-channel field-effect transistor 1361 may be adjusted by changing the division ratio using the variable resistances.

Figure 7:
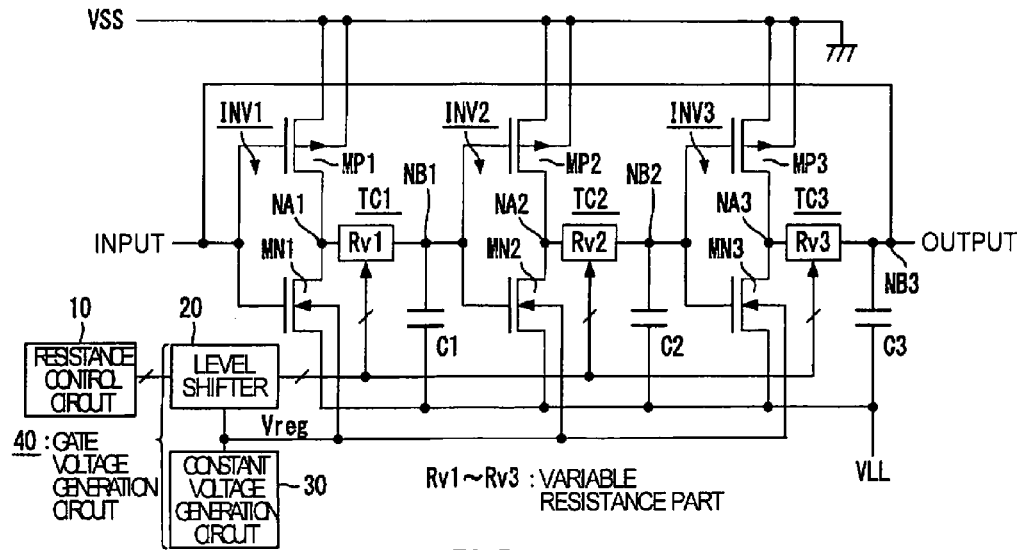
FIG. 7 is a circuit diagram showing a configuration of a CR oscillation circuit as another embodiment of the invention.

(6) In the CR oscillation circuit in the above described embodiment (see FIGS. 1 and 2), the positive power supply is used and the low-potential power supply voltage is used as the ground voltage. However, as shown in FIG. 7, a CR oscillation circuit using a negative power supply that generates a negative low-potential power supply voltage VLL and the high-potential power supply voltage VSS as the ground voltage may be formed. In the CR oscillation circuit shown in FIG. 7, the high-potential power supply voltage VSS is provided to the sources and the substrates of the P-channel field-effect transistors MP1 to MP3 and the low-potential power supply voltage VLL is provided to the substrates of the N-channel field-effect transistors MN1 to MN3 of the inverters INV1 to INV3 as the switching gates. Further, the capacitors C1 to C3 of the CR time constant circuits TC1 to TC3 are inserted between the nodes NB1 to NB3 and the low-potential power supply line for supplying the low-potential power supply voltage VLL, respectively.

The resistance control circuit 10 is a circuit that outputs a selection signal Si (i=1 to N, N is an integer equal to or more than two) for controlling the resistance values of the variable resistance parts Rv1 to Rv3. The selection signal Si (i=1 to N) is a binary signal at an H-level=VSS or an L-level=VLL.

The level shifter 20 is a circuit that shifts the level of each selection signal Si (i=1 to N) to a binary signal at an H-level=VSS and an L-level=Vreg and outputs the signal as a two-phase complementary signal.

The constant voltage generation circuit 30 is a circuit that generates the constant voltage Vreg (in this case, a negative constant voltage) in conjunction with the threshold voltage of the field-effect transistor forming the circuit. The constant voltage Vreg is provided to the respective sources of the N-channel field-effect transistors MN1, MN2, and MN3 in FIG. 7 and provided to the level shifter 20 as the low-potential power supply voltage. Further, the constant voltage Vreg is also provided to the variable resistance parts Rv1 to Rv3.

Figure 8:
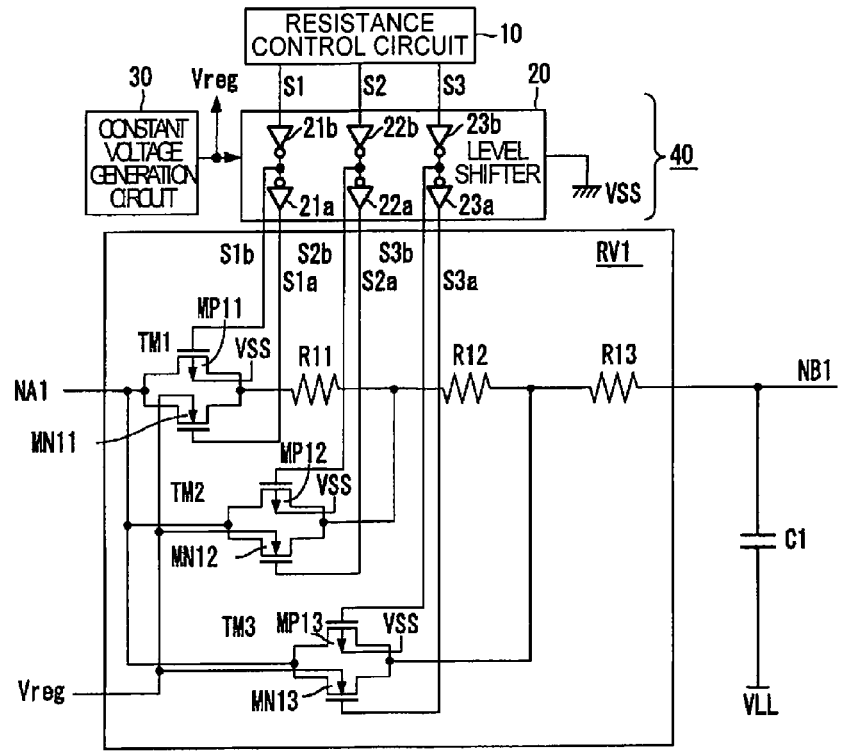
FIG. 8 is a circuit diagram showing configurations of a variable resistance part and a level shifter in the embodiment and a relationship between those and a resistance control circuit and a constant voltage generation circuit.

FIG. 8 is a circuit diagram showing configurations of the variable resistance part Rv1 and the level shifter 20 and a relationship between those and the resistance control circuit 10 and the constant voltage generation circuit 30. As is the case in FIG. 2, the level shifter 20 has inverters 21a, 21b, 22a, 22b, 23a, 23b. Note that the power supply voltage VSS is provided as the high-potential power supply voltage and the negative constant voltage Vreg output by the constant voltage generation circuit 30 is provided as the low-potential power supply voltage to the inverters. More specifically, the high-potential power supply voltage VSS is provided to the sources and the substrates of the respective P-channel field-effect transistors of the inverters 21a, 21b, 22a, 22b, 23a, 23b. Further, the negative constant voltage Vreg output by the constant voltage generation circuit 30 is provided to the sources and the substrates of the respective N-channel field-effect transistors of the inverters 21a, 21b, 22a, 22b, 23a, 23b. Therefore, gate signals S1a, S1b, S2a, S2b, S3a, S3b output by these inverters are signals at an H-level of VSS and at an L-level of Vreg. Note that FIG. 8 shows only the configuration of the variable resistance part Rv1 of the variable resistance parts Rv1 to Rv3 in FIG. 1, and the other variable resistance parts Rv2 and Rv3 have the same configuration of that of variable resistance part Rv1.

As shown in FIG. 8, the configuration of the variable resistance part Rv1 is the same as that of the above described embodiment (FIG. 2) except the following points. First, the high-potential power supply voltage (or ground voltage) VSS is provided to the respective substrates (or N-wells) of the P-channel field-effect transistors MP11, MP12, and MP13. Further, the negative constant voltage Vreg output by the constant voltage generation circuit 30 is provided to the respective substrates (or P-wells) of the N-channel field-effect transistors MN11, MN12, and MN13.

The configuration of the embodiment shown in FIGS. 7 and 8 is as described above.

Also, in the embodiment, the voltage Vreg or −Vreg is provided between the gates and the substrates of the field-effect transistors of the transmission gate to be turned ON. When the threshold voltage Vth of the field-effect transistor forming the transmission gate decreases due to rise of the ambient temperature, the absolute value of the negative constant voltage Vreg decreases in conjunction with the threshold voltage Vth. Accordingly, even when the ambient temperature rises, the voltages that contribute to channel formation of the respective field-effect transistors forming the transmission gate are kept constant and the ON-resistance RON of the transmission gate is kept constant. Therefore, an advantage that the dependency of the oscillation frequency of the CR oscillation circuit on the ambient temperature may be suppressed is obtained. Further, the voltage Vreg is provided to the sources of the N-channel field-effect transistors MN1 to MN3 of the inverters INV1 to INV3. Accordingly, for example, in the case where the threshold voltages of the N-channel field-effect transistors MN1 to MN3 decrease due to the rise of the ambient temperature, the absolute value of the negative constant voltage Vreg decreases in conjunction with the threshold voltages, and the source voltages of the respective N-channel field-effect transistors MN1 to MN3 rise. Therefore, fluctuations of the ON-resistances of the N-channel field-effect transistors MN1 to MN3 of the inverters INV1 to INV3 due to changes in ambient temperature may be suppressed. Also, in this regard, the dependency of the oscillation frequency of the CR oscillation circuit on the ambient temperature may be suppressed.

(7) In the embodiment shown in FIGS. 7 and 8, in order to prevent increase in threshold voltage due to the back-gate effect, the constant voltage Vreg may be supplied from the constant voltage generation circuit 30 to the sources and the substrates of the N-channel field-effect transistors MN1 to MN3 of the inverters INV1 to INV3.

The entire disclosure of Japanese Patent Application No. 2015-081258, filed Apr. 10, 2015 is expressly incorporated by reference herein.

What is claimed is:

1. A CR oscillation circuit comprising:
at least one switching gate forming a loop for circulation of a signal;
a CR time constant circuit inserted into the loop for delaying the signal, the circuit having a capacitor, a plurality of resistance elements, and a selection part that selects an arbitrary resistance element of the plurality of resistance elements as a charge and discharge path of the capacitor; and
a control section that controls ON/OFF of the selection part and controls the selection part so that temperature characteristics of a resistance value of the selection part may be constant when the selection part is turned ON,
the selection part including a transmission gate, and
the control section having a gate voltage generation unit that outputs a gate voltage for controlling ON/OFF of the transmission gate and outputs a constant voltage in conjunction with a threshold voltage of a field-effect transistor as a gate voltage for turning ON the transmission gate.

2. The CR oscillation circuit according to claim 1, wherein
the transmission gate in the CR time constant circuit is provided on a side of an output node and the resistance element is provided on a side of the capacitor of the switching gate.

3. The CR oscillation circuit according to claim 1, wherein
the transmission gate includes a P-channel field-effect transistor and an N-channel field-effect transistor, and the constant voltage output by the gate voltage generation unit is supplied to a substrate of the P-channel field-effect transistor or a substrate of the N-channel field-effect transistor.

4. The CR oscillation circuit according to claim 1, wherein
the switching gate includes a P-channel field-effect transistor and an N-channel field-effect transistor, and the constant voltage output by the gate voltage generation unit is supplied to a source of the P-channel field-effect transistor or a source of the N-channel field-effect transistor of the switching gate.

5. The CR oscillation circuit according to claim 1, wherein
the switching gate includes a P-channel field-effect transistor and an N-channel field-effect transistor, and the constant voltage output by the gate voltage generation unit is supplied to a source and a substrate of the P-channel field-effect transistor of the switching gate or a source and a substrate of the N-channel field-effect transistor of the switching gate.

6. The CR oscillation circuit according to claim 1, wherein
the control section further includes a resistance control circuit that outputs a selection signal for designating ON/OFF of the transmission gate, and
the gate voltage generation unit includes a constant voltage generation circuit that outputs the constant voltage, and a level shifter that is supplied with the constant voltage, shifts a level of the selection signal, and outputs the gate voltage.

7. The CR oscillation circuit according to claim 6, wherein
the level shifter includes an inverter.

8. The CR oscillation circuit according to claim 7, wherein
the inverter includes a P-channel field-effect transistor and an N-channel field-effect transistor, and the constant voltage output by the constant voltage generation circuit is supplied to a source and a substrate of the P-channel field-effect transistor of the inverter or a source and a substrate of the N-channel field-effect transistor of the switching gate.

9. The CR oscillation circuit according to claim 1, wherein
the gate voltage generation unit includes a constant voltage generation circuit that has a differential transistor pair of two field-effect transistors with different threshold voltages and outputs an offset voltage due to a difference between the threshold voltages as the constant voltage.

* * * * *